US006809930B2

(12) United States Patent
Mueller et al.

(10) Patent No.: US 6,809,930 B2
(45) Date of Patent: Oct. 26, 2004

(54) COOLING A MICROCHIP ON A CIRCUIT BOARD

(75) Inventors: Marcus Mueller, Sindelfingen (DE); Jochen Zaiser, Holzgerlingen (DE)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 10/448,950

(22) Filed: May 30, 2003

(65) Prior Publication Data

US 2004/0090745 A1 May 13, 2004

(30) Foreign Application Priority Data

Nov. 8, 2002 (EP) ............................................. 02024869

(51) Int. Cl.[7] ................................................ H05K 7/20
(52) U.S. Cl. ........................ 361/704; 361/717; 361/718; 361/719; 257/718; 257/727
(58) Field of Search ................................ 361/690, 697, 361/704, 719; 257/718, 727; 174/16.1, 16.3; 165/80.3, 185

(56) References Cited

U.S. PATENT DOCUMENTS

| | | | |
|---|---|---|---|
| 3,356,904 A | 12/1967 | Yonkers ..................... 317/100 |
| 5,089,936 A | 2/1992 | Kojima et al. .............. 361/387 |
| 5,190,097 A | 3/1993 | Selby et al. ................ 165/80.2 |
| 5,325,265 A | 6/1994 | Turlik et al. ................ 361/702 |
| 5,552,961 A | * | 9/1996 | Van Gaal et al. ........... 361/700 |
| 5,648,889 A | * | 7/1997 | Bosli .......................... 361/704 |
| 5,735,340 A | | 4/1998 | Mira et al. .................. 165/80.3 |
| 5,757,621 A | | 5/1998 | Patel .......................... 361/719 |
| 5,883,782 A | * | 3/1999 | Thurston et al. ............ 361/704 |
| 6,018,193 A | * | 1/2000 | Rubens et al. .............. 257/720 |
| 6,046,905 A | | 4/2000 | Nelson et al. .............. 361/704 |
| 6,154,365 A | * | 11/2000 | Pollard et al. .............. 361/704 |
| 6,301,115 B1 | * | 10/2001 | Hashimoto et al. ......... 361/704 |
| 6,381,136 B1 | * | 4/2002 | Nelson et al. .............. 631/704 |
| 6,444,496 B1 | | 9/2002 | Edwards et al. ............ 438/122 |
| 6,459,582 B1 | * | 10/2002 | Ali et al. ..................... 361/704 |
| 6,469,893 B1 | * | 10/2002 | Frutschy et al. ............ 361/700 |
| 6,504,243 B1 | * | 1/2003 | Andric et al. ............... 257/718 |
| 6,545,352 B1 | * | 4/2003 | Ruckdeschel ............... 257/718 |

* cited by examiner

Primary Examiner—Boris Chervinsky

(57) ABSTRACT

The present invention refers to an electronic apparatus, preferably a microchip testing device, comprising at least one circuit board mounted on a cooling device. This circuit board supports at least one microchip. The circuit board supports the microchip on a side turned to the cooling device, wherein the cooling device is adapted for providing a cooling of a side of the microchip, which side is turned to the cooling device. A thermal conductor is arranged between the microchip and the cooling device for providing a thermal contact between the cooling device and the one side of the microchip turned to the cooling device. The thermal conductor comprises at least one of a group comprising: a thermally conductive knead, a plasticine, a kneadable and thermally conductive material, and a plastically deformable and thermally conductive material.

13 Claims, 2 Drawing Sheets

COOLING A MICROCHIP ON A CIRCUIT BOARD

BACKGROUND OF THE INVENTION

The present invention relates to cooling a microchip on a circuit board.

Electronic apparatuses usually comprise one or more circuit boards, in particular printed circuit boards, each supporting one or more microchips. High performance microchips produce heat, which has to be transported away from the microchips to prevent damage of the microchips and to achieve a high lifetime for the microchips. To this aim a modern apparatus comprises a cooling device, in particular based on fluid or water cooling. Such a cooling device usually has a cooling plate, on which the circuit board is mounted.

Higher performance generally leads to rising heat output, therefore requiring better cooling.

U.S. Pat. No. 6,444,496 discloses usage of a perform for introducing thermal paste into semiconductor packages.

U.S. Pat. No. 5,757,621 discloses a heat sink assembly, wherein a viscous fluid as thermally conductive compound is applied between an electronic device and the heat sink.

SUMMARY OF THE INVENTION

It is an object of the present invention to provide an improved cooling. The object is solved by the independent claims. Preferred embodiments are shown by the dependent claims.

The mounting of the microchip at that side of the circuit board, that is facing the cooling device, provides a very short path for the heat transfer. Accordingly, the cooling of the microchip performs with a higher efficiency.

A microchip is provided having an electronically passive side supporting an electronically active side. Said active side comprises all integrated circuits, electronic elements like transistors, diodes etc., and therefore produces heat during operation. A direct cooling of the active side is not advisable, as the active side is very touchy. By arranging the microchip with its electronically active side facing the circuit board and with its electronically passive side turned to the cooling device, the cooling can be enhanced further. This special arrangement takes into consideration that on one hand the heat producing active side is strongly and thermally conducted with the passive side, and on the other hand that the passive side is not touchy and therefore allows direct cooling. The preferred embodiments consequently use this cognition to improve the heat transfer path and to increase the cooling.

According to manufacturing tolerances there may occur a gap in-between the microchip and the cooling device. Such gap represents a very high thermal resistance in the heat transfer path from the microchip to the cooling device. Therefore, in another embodiment the cooling can be enhanced by means of a thermal conductor, which is arranged between the microchip and the cooling device and which thermally contacts the respective side of the microchip, preferably its passive side, with the cooling device. This thermal conductor fills out the gap and consequently improves the heat transfer from the microchip to the cooling device.

Since the aforementioned manufacturing tolerances might lead to gaps with different distances between the microchip and the cooling device, the thermal conductor is preferably designed to cover the largest possible gap. If smaller gaps occur, the thermal conductor might have to be squeezed. This squeezing may result in reset forces leading to impermissibly high tensions in the circuit board. To prevent damage of the circuit board an advanced embodiment suggests the use of a thermally conductive and kneadable or plastically deformable material, e.g. thermally conductive knead or plasticine, as the thermal conductor. Such a material, like knead or plasticine, can be deformed easily, wherein this deformation is mostly performed plastically and hardly elastically, such that after the deformation the material shows practically no reset forces. Since the proposed thermal conductor is kneadable, it can easily be adapted to each possible gap, wherein the missing reset forces prevent high tensions in the circuit board and therefore prevent harming the circuit board.

According to the viscosity of the kneadable thermal conductor its deformation requires either relative high deformation forces to reach a short deformation time or a relative long deformation time by using small forces. Since circuit boards are mounted on the cooling device automatically in the scope of a mass-production, the mounting has to be performed in a time too short for individually adapting the thermal conductors to the respective gaps. A preferred embodiment overcomes this difficulty by mounting the circuit board on the cooling device in a way that the circuit board or at least a area of the circuit board, which supports the microchip, is loosely secured to the cooling device, i.e. the circuit board or at least its microchip supporting area is with respect to the cooling device movably attached to the cooling device. Furthermore the circuit board or at least its microchip supporting area is pre-stressed against the cooling device with a predetermined pre-stress force, which can be designed according to the requirements of the deformation of the thermal conductor and according to the elasticity of the circuit board. Therefore, impermissible high tensions in the circuit board can be prevented. This pre-stress force and the said loose attachment of the circuit board are achieved by means of a pre-stress device, which preferably comprises at least one spring member and at least one support member. The support member is fixedly mounted on the cooling plate and supports the spring member pre-stressing the printed circuit board against the cooling plate with the predetermined or designed pre-stress force.

A preferred embodiment of the present invention is used in an automated test equipment (ATE) for testing or verifying Integrated Circuits (IC). ICs generally need to be tested to assure proper operation. This—in particular—is required during IC development and manufacturing. In the latter case, the ICs are usually tested before final application. During test, the IC, as device under test (DUT), is exposed to various types of stimulus signals, and its responses are measured, processed and usually compared to an expected response of a good device. Automated test equipments (ATE) usually perform these tasks according to a device-specific test program. Examples for ATE are the Agilent 83000 and 93000 families of Semiconductor Test Systems of Agilent Technologies as disclosed e.g. under http://www.ate.agilent.com/ste/products/intelligent test/SOC test/SOC Tech Oview.shtml. Details of those families are also disclosed e.g. in EP-A-859318, EP-A-864977, EP-A-886214, EP-A-882991, EP-A-1092983, U.S. Pat. No. 5,499, 248, U.S. Pat. No. 5,453,995. The teaching of those documents shall be incorporated herein by reference.

BRIEF DESCRIPTION OF THE DRAWINGS

Other objects and many of the attendant advantages of the present invention will be readily appreciated and become better understood by reference to the following detailed description when considered in connection with the accompanying drawings. Features that are substantially or functionally equal or similar will be referred to with the same reference sign(s).

DETAILED DESCRIPTION OF THE INVENTION

Figure 1:
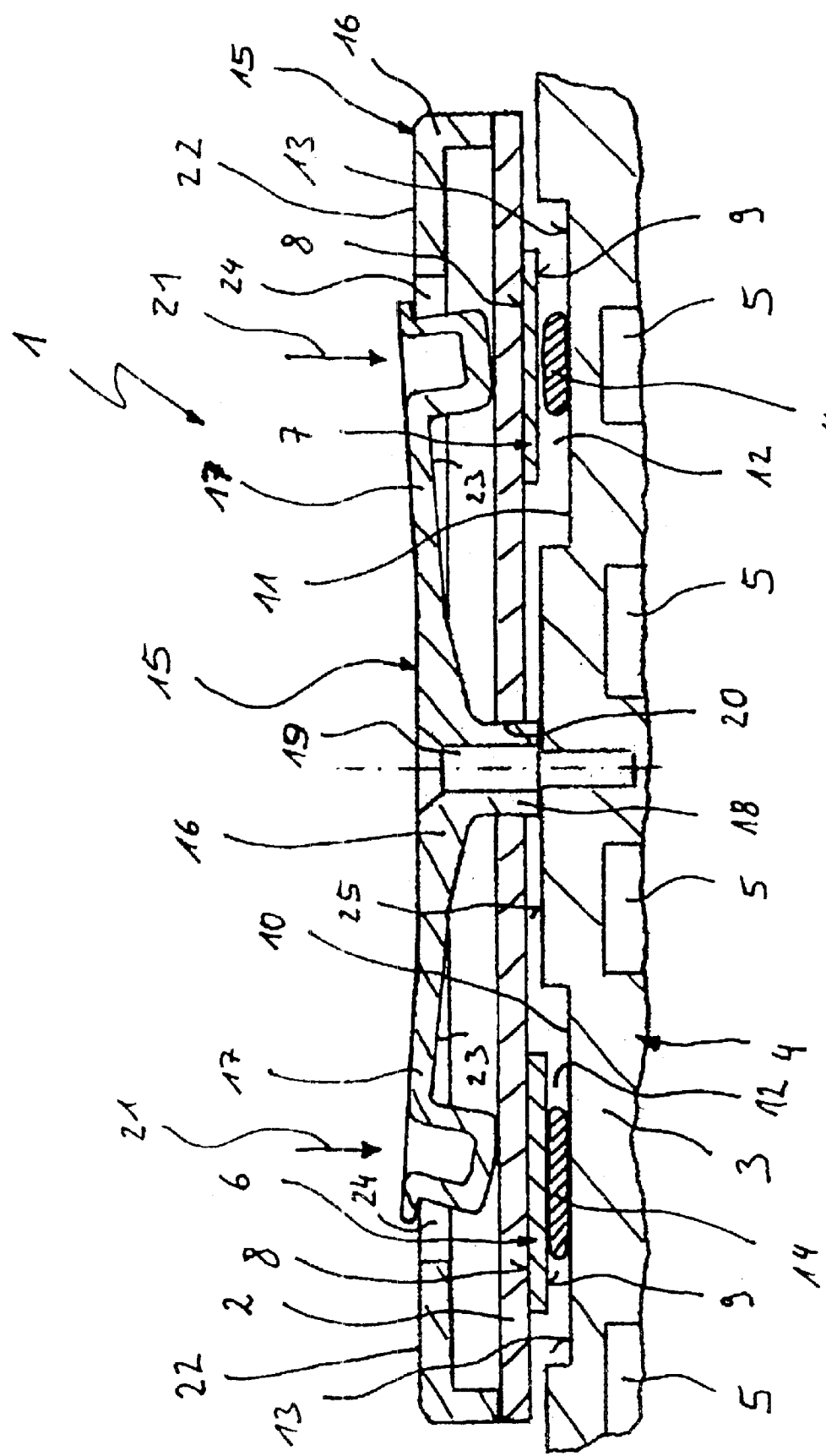
FIGS. 1 and 2 depict a schematic section through a circuit board mounted on a cooling device at different states.
Figure 2:
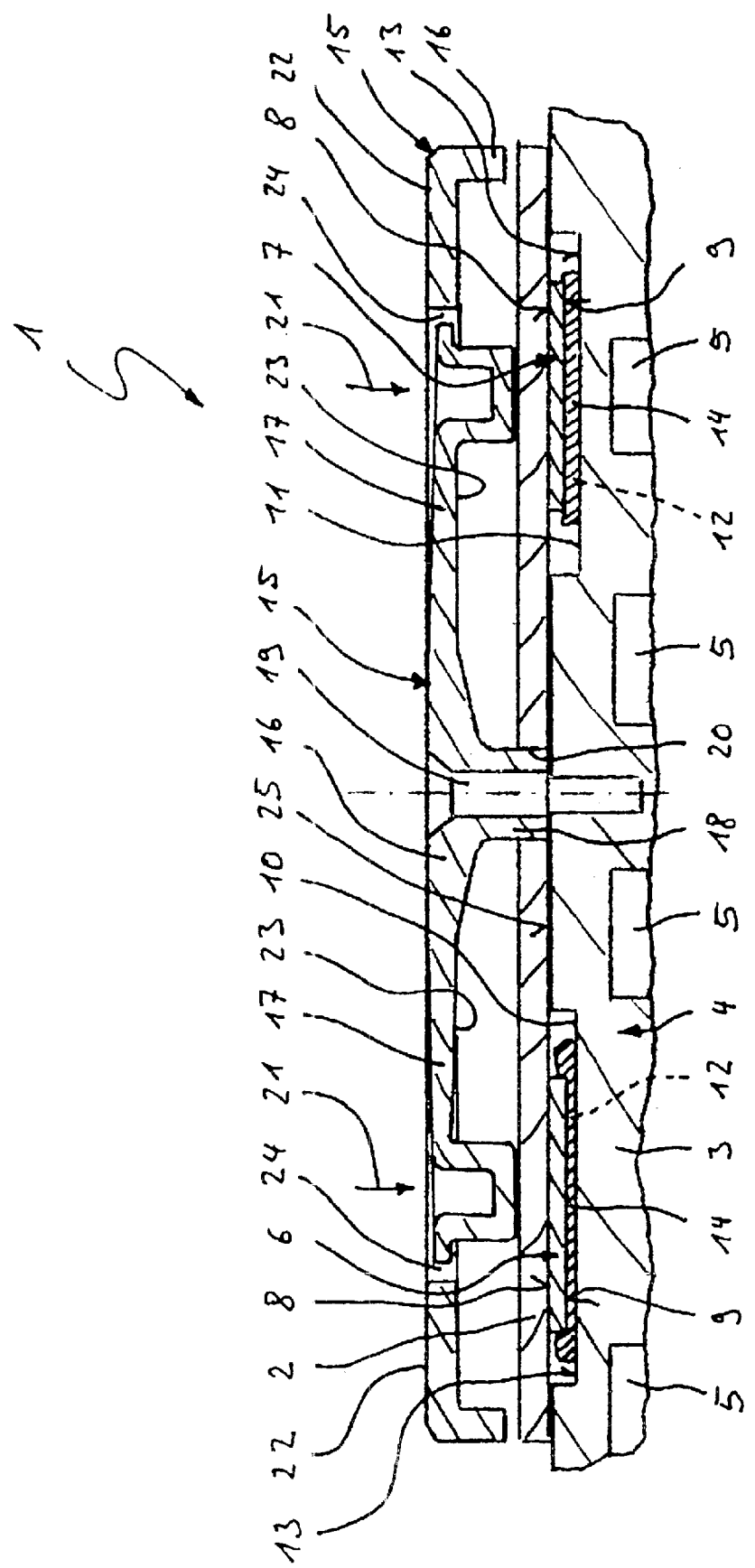

Referring to the FIGS. 1 and 2 an electronic apparatus 1 according to the invention comprises at least one, preferably printed, circuit board 2 mounted on a cooling plate 3 of a cooling device 4. The apparatus 1 may be e.g. a microchip testing device comprising a lot of printed circuit boards 2 and cooling plates 3. The cooling device 4 operates preferably with a liquid cooling fluid, e.g. water, which flows through cooling channels 5.

The printed circuit board 2 supports at least one, but in this example at least two microchips 6 and 7 each having an electronically active side 8 and an electronically passive side 9. In the present context the "electronically active side" indicates the outside of that part or portion of the microchip 6 and 7, in which the highly integrated circuits, semiconductors, transistors etc. are arranged, whereas the "electronically passive side" indicates the outside of the other part or portion of the microchip 6 and 7 forming a substrate, which supports the highly integrated circuits, semiconductors, transistors etc. and is usually made of ceramics. Generally the active side 8 and the passive side 9 of the microchip 6, 7 are made in one piece. During operation of the microchips 6 and 7 heat is generated—according to the aforementioned structure—at or in the electronically active part or side 8 of the respective microchip 6, 7, and directly transferred into the electronically passive part or side 9 coupled with the active side 8

According to a preferred embodiment of the invention the microchips 6, 7 are arranged between the printed circuit board 2 and the cooling plate 3 and are mounted on the printed circuit board 2 such that their electronically active sides 8 are turned to the printed circuit board 3, whereas their electronically passive sides 9 are turned to the cooling plate 3.

For each microchip 6, 7 the cooling plate 3 comprises a cavity 10 or 11, respectively. After mounting the printed circuit board 2 on the cooling plate 3 each microchip 6, 7 intrudes into the respective cavity 10, 11. On manufacturing the microchips 6, 7 and the printed circuit board 2 manufacturing tolerances are unavoidable. E.g. it may occur different distances between the microchips passive side 9 and the printed circuit board 2. Also the cavities 10,11 may differ in their depth. Consequently there is provided a gap 12 between the cooling plate 3 and the microchip 6, 7 or between the microchips passive side 9 and a ground 13 of the respective receptacle 10, 11. This gap 12 disturbs the heat transfer from the microchip 6, 7 to the cooling plate 3 and establishes a disturbing thermal resistor in this heat transfer path. To close this disturbing gap 12 a thermal conductor 14 is arranged between the microchip 6, 7 and the cooling plate 3. According to a preferred embodiment of the present invention this thermal conductor 14 is made of thermally conductive and kneadable or plastically deformable material, e.g. thermally conductive knead or plasticine.

The printed circuit board 2 or at least the zone or portion shown in the FIGS. 1 and 2 is mounted on the cooling plate 3 with help of at least one pre-stress device 15 comprising at least one support member 16 and at least one spring member 17. In the example depicted in the FIGS. 1 and 2 the pre-stress device 15 has two spring members 17, one for each microchip 6, 7. The supporting member 16 supports the spring members 17, is fixedly mounted on the printed circuit board 2, e.g. by means of a screw 19, and is advantageously formed as a cover plate 22 covering the printed circuit board 2.

The pre-stress device 15 is designed to establish a loose mounting of the printed circuit board 2 on the cooling plate 3. Therefore, the printed circuit board 2 is movable between a lifted position according to FIG. 1 and a lowered position according to FIG. 2.

The spring members 17 are arranged at a side of the printed circuit board 2 turned away from the cooling plate 3. Each spring member 17 is supported by the support member 16 and provides a predetermined pre-stress force according to arrows 21, with which the respective spring member 17 presses against the printed circuit board 2. Consequently the printed circuit board 2 is pressed against the cooling plate 3 with this pre-stress force(s) 21.

In the embodiment of the FIGS. 1 and 2 each spring member 17 is formed as an integrated part of the cover plate 22, i.e. the spring members 17 and the cover plate 22 and thus the support member 16 are one piece. Each spring member 17 is here formed by a flexible tongue 23 extending from the cover plate 22. Such a tongue 23 may be provided by cutting a U-shaped trench 24 into the cover plate 22. After cutting, the tongues 23 have to be plastically bent into the direction of the pre-stress force 21 to provide them with the desired spring characteristics. In another embodiment the spring members 17 may be provided by an accordingly adapted mould with a correspondingly adapted shape.

The spring members 17 are preferably arranged in such a way, that they abut on the printed circuit board 2 and therefore introduce their pre-stress forces 21 into the printed circuit board 2 centric with regard to the respective microchip 6, 7.

The pre-stress device 15 may also comprise a guiding member 18, which is fixedly mounted on the printed circuit board 2 and is here exemplarily formed as a rod. The guiding member 18 or the rod, respectively, has an outer contour, which may be cylindrical and extends through an opening 20. This opening 20 is provided in the printed circuit board 2 and has an inner contour complementary to the outer contour of the rod 18. Thus the opening 20 here has a cylindrical inner contour. The rod 18 extends perpendicularly to parallel planes of the printed circuit board 2 and the cooling plate 3. Therefore, the guiding member 18 cooperates with the printed circuit board 2 and provides a guided movement of the printed circuit board 2 in the direction of the pre-stress forces 21. In this example the guiding member 18 is integrated into the support member 16, i.e. the guiding member 18 and the support member 16 are manufactured in one piece. Thus, the guiding member 18 is fixedly mounted on the cooling plate 3 via the support member 16.

The lifted or initial position according to FIG. 1 represents a status immediate after fixing the support member 16 on the cooling plate 3, e.g. by means of the screw 19. In this status the thermal conductor 14 shows approximately his initial shape. The mounting of the printed circuit board 2 on the cooling plate 3 is finished, though the printed circuit board 2 has not reached its lowered or final position according to FIG. 2. The lowering of the printed circuit board 2 is performed with help of the pre-stress device 15 by means of the pre-stress forces 21. These pre-stress forces 21 are chosen such that the thermal conductor 14 is squeezed and plastically deformed or kneaded, whereas impermissible stressing of the printed circuit board 2 can be avoided. After a certain period of time the printed circuit board 2 achieves its final position according to FIG. 2. This final position is defined by an abutment provided by a surface 25 of the cooling plate 3, at which the printed circuit board 2 abuts since it arrives in its lowered position. In the final position the thermal conduct 14 is squeezed and fills up the gap 12. Therefore, a very short and direct heat transfer path is established improving the cooling effectiveness. In this context it is of specific importance, that the kneadable thermal conductor 14 closes the gap 12 independently of the width of the gap 12. Therefore, a very high performing thermal contact between the microchips 6, 7 and the cooling plate 3 can be provided in spite of the aforementioned manufacturing tolerances.

What is claimed is:

1. Electronic apparatus, preferably a microchip testing device, comprising:
    a circuit board having at least one microchip, and
    a cooling device adapted for providing a cooling of one side of the microchip, which side is turned to the cooling device, and
    a thermal conductor arranged between the microchip and the cooling device for providing a thermal contact between the cooling device and the one side of the microchip turned to the cooling device,
    wherein the thermal conductor comprises a kneadable and thermally conductive material, and
    wherein the circuit board is, at least in a zone supporting the microchip, loosely mounted on the cooling device and pre-stressed against the cooling device by means of a pre-stress device, thereby preventing impermissible high tensions in the circuit board.

2. Electronic apparatus according to claim 1, wherein:
    the microchip has an electronically active side and an electronically passive side,
    the microchip is arranged at the circuit board, such that its active side is turned to the printed circuit board and that its passive side is turned to the cooling device,
    the cooling device provides a cooling of said passive side.

3. Electronic apparatus according to claim 1, wherein the cooling device is provided with at least one receptacle, into which the microchip intrudes.

4. Electronic apparatus according to claim 1, wherein the pre-stress device comprises at least one of:
    at least one spring member and at least one support member, wherein the support member is fixedly mounted on the cooling device and supports the spring member pre-stressing the circuit board against the cooling device with a predetermined pre-stress force; and
    a guiding member fixedly mounted on the cooling device and cooperating with the circuit board to provide a guided movement of the circuit board at least in the zone supporting the microchip with respect to the cooling device.

5. Electronic apparatus according to claim 4, wherein the guiding member comprises at least one of the features:
    the guiding member provides a guided movement of the circuit board at least in the zone supporting the microchip perpendicular to the parallel planes of the circuit board and the cooling device;
    the guiding member comprises at least one rod having an outer contour and penetrating an opening, which is provided in the circuit board and has an inner contour complementary to the outer contour of the rod; and
    the guiding member is integrated into the support member.

6. Electronic apparatus according to claim 4, comprising at least one of the features:
    the support member is formed as a cover plate covering the circuit board;
    the spring member is integrated into the cover plate;
    the spring member is formed by a flexible tongue provided by cutting a U-shaped trench into the cover plate and plastically bending it in the direction of the pre-stress force;
    the spring member is arranged for introducing the pre-stress force into the circuit board at a side turned away from the cooling device;
    the spring member is provided for introducing the pre-stress force into the circuit board centric with respect to the microchip.

7. Electronic apparatus according to claim 1, wherein an abutment is provided for defining a predetermined final position for the circuit board with respect to the cooling device.

8. Electronic apparatus according to claim 2, comprising at least one of the features:
    the electronically active side comprises contacts adapted for electronically contacting the microchip, and the electronically passive side is free of contacts for electronically contacting the microchip; and
    the electronically active side represents the side of the microchip wherein electronic circuits have been integrated into one side of a semiconductor substrate, while the electronically passive side is facing opposite to the electronically active side and substantially represents the semiconductor substrate.

9. Electronic apparatus according to claim 1, wherein the thermal conductivity of the thermal conductor is in a range between 0.1 and 10 W per m*K, and preferably between 1 and 5 W per m*K.

10. Electronic apparatus according to claim 1, wherein the electronic apparatus is an automated test equipment adapted for testing or verifying an integrated circuit.

11. A method comprising the steps of:
    providing a circuit board bearing at least one microchip turned with one side towards the circuit board and with another side towards a cooling device,
    providing the cooling device for cooling the one side of the microchip, which side is turned to the cooling device,
    arranging a kneadable and thermally conductive material between the microchip and the cooling device for thermally contacting the cooling device with the one side of the microchip turned to the cooling device, and
    pre-stressing at least one of the printed circuit board and the microchip against the cooling device, thereby preventing impermissible high tensions in the circuit board.

12. The method of claim 11 further comprising the step of:
    arranging the microchip at the circuit board, such that its active side is turned to the printed circuit board and that its passive side is turned to the cooling device, so that the cooling device provides a cooling of said passive side.

13. The method of claim 11 wherein the circuit board is, at least in a zone supporting the microchip, loosely mounted on the cooling device and pre-stressed against the cooling device by means of a pre-stress device, thereby preventing impermissible high tensions in the circuit board.

* * * * *